US011515237B2

(12) United States Patent
Tang et al.

(10) Patent No.: US 11,515,237 B2
(45) Date of Patent: Nov. 29, 2022

(54) PLURALITY OF HEAT SINKS FOR A SEMICONDUCTOR PACKAGE

(71) Applicant: Agency for Science, Technology and Research, Singapore (SG)

(72) Inventors: Gongyue Tang, Singapore (SG); Kazunori Yamamoto, Singapore (SG); Xiaowu Zhang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 24 days.

(21) Appl. No.: 17/264,792

(22) PCT Filed: Jul. 29, 2019

(86) PCT No.: PCT/SG2019/050368
§ 371 (c)(1),
(2) Date: Jan. 29, 2021

(87) PCT Pub. No.: WO2020/032871
PCT Pub. Date: Feb. 13, 2020

(65) Prior Publication Data
US 2021/0296217 A1    Sep. 23, 2021

(30) Foreign Application Priority Data

Aug. 8, 2018 (SG) .......................... 10201806765V

(51) Int. Cl.
*H01L 23/34* (2006.01)
*H01L 21/00* (2006.01)
(Continued)

(52) U.S. Cl.
CPC ........ *H01L 23/49568* (2013.01); *H01L 23/34* (2013.01); *H01L 23/3677* (2013.01);
(Continued)

(58) Field of Classification Search
CPC ....... H01L 25/18; H01L 25/50; H01L 25/072; H01L 24/33; H01L 24/73; H01L 24/92;
(Continued)

(56) References Cited

U.S. PATENT DOCUMENTS 7,999,369 B2 * 8/2011 Malhan ................... H01L 25/18
257/E23.071
9,041,183 B2   5/2015 Liang et al.
(Continued)

FOREIGN PATENT DOCUMENTS

DE      102004018477 B4    8/2008

OTHER PUBLICATIONS

The International Search Report and Written Opinion for counterpart PCT Application No. PCT/SG2019/050368 dated Oct. 10, 2019, 9 pages.
(Continued)

*Primary Examiner* — Alonzo Chambliss
(74) *Attorney, Agent, or Firm* — Womble Bond Dickinson (US) LLP

(57) ABSTRACT

Various embodiments may provide a semiconductor package. The semiconductor package may include a first electrical component, a second electrical component, a first heat sink, and a second heat sink bonded to a first package interconnection component and a second package interconnection component. The first package interconnection component and the second package interconnection component may provide lateral and vertical interconnections in the package.

18 Claims, 13 Drawing Sheets

(51) Int. Cl.
      H05K 7/18      (2006.01)
      H05K 7/20      (2006.01)
      H01L 23/495    (2006.01)
      H01L 23/538    (2006.01)
      H01L 23/00     (2006.01)
      H01L 25/18     (2006.01)
      H01L 25/00     (2006.01)
      H01L 23/367    (2006.01)
      H01L 23/473    (2006.01)

(52) U.S. Cl.
      CPC .. *H01L 23/49537* (2013.01); *H01L 23/49562* (2013.01); *H01L 23/49575* (2013.01); *H01L 23/5385* (2013.01); *H01L 23/5387* (2013.01); *H01L 23/5389* (2013.01); *H01L 24/33* (2013.01); *H01L 24/40* (2013.01); *H01L 24/73* (2013.01); *H01L 24/92* (2013.01); *H01L 25/18* (2013.01); *H01L 25/50* (2013.01); *H01L 23/473* (2013.01); *H01L 23/49513* (2013.01); *H01L 23/49579* (2013.01); *H01L 24/32* (2013.01); *H01L 2224/32225* (2013.01); *H01L 2224/32245* (2013.01); *H01L 2224/33181* (2013.01); *H01L 2224/33505* (2013.01); *H01L 2224/40101* (2013.01); *H01L 2224/40105* (2013.01); *H01L 2224/40139* (2013.01); *H01L 2224/40225* (2013.01); *H01L 2224/40245* (2013.01); *H01L 2224/73213* (2013.01); *H01L 2224/73263* (2013.01); *H01L 2224/9211* (2013.01); *H01L 2224/92246* (2013.01); *H01L 2924/10272* (2013.01); *H01L 2924/12032* (2013.01); *H01L 2924/13091* (2013.01)

(58) Field of Classification Search
      CPC ............. H01L 23/5385; H01L 23/5387; H01L 23/5389; H01L 23/49568; H01L 23/34; H01L 23/49537; H01L 23/49562; H01L 23/49575; H01L 23/3672; H01L 23/3677
      See application file for complete search history.

(56)           References Cited

U.S. PATENT DOCUMENTS

| 2005/0161785 | A1  | 7/2005  | Kawashima et al. |
| 2007/0132091 | A1  | 6/2007  | Wu et al. |
| 2009/0152714 | A1  | 6/2009  | YAMAGISHI et al. |
| 2009/0231810 | A1  | 9/2009  | Liang et al. |
| 2011/0057713 | A1* | 3/2011  | Kawanami ............ H01L 25/16 361/728 |
| 2013/0020694 | A1  | 1/2013  | Liang et al. |
| 2015/0102479 | A1  | 4/2015  | Fuergut et al. |
| 2015/0179611 | A1* | 6/2015  | Lu .................. H01L 23/5389 257/659 |
| 2015/0357303 | A1  | 12/2015 | Kohl et al. |
| 2018/0122782 | A1  | 5/2018  | Weidner et al. |

OTHER PUBLICATIONS

The International Preliminary Report on Patentability for couterpart PCT Application No. PCT/SG2019/050368 dated Feb. 9, 2021, 6 pages.

* cited by examiner

7. Molding

8. Dielectric material coating

9. Heat sink attachment

Embodiment

Temperature difference between sensor and power chip: 10 °C

Alternative power chip and sensor integration

Temperature difference between sensor and power chip: 27 °C

PLURALITY OF HEAT SINKS FOR A SEMICONDUCTOR PACKAGE

CROSS-REFERENCE TO RELATED APPLICATIONS

This patent application is a U.S. National Phase Application under 35 U.S.C. § 371 of International Application No. PCT/SG2019/050368, filed 29 Jul. 2019, entitled SEMICONDUCTOR PACKAGE AND METHOD OF FORMING THE SAME, which claims the benefit of priority of Singapore application No. 10201806765V filed Aug. 8, 2018, the contents of which were incorporated by reference in the entirety for all purposes.

TECHNICAL FIELD

Various aspects of this disclosure relate to a semiconductor package. Various aspects of this disclosure relate to a method of forming a semiconductor package.

BACKGROUND

Power electronics devices are extensively used in the areas of aerospace, automotive, solar panels, wind generators, oil & gas and power grids for efficient electrical power delivery requirements. With the evolution of the power electronics devices in semiconductor industry, the demand for power modules with low power consumption and high efficiency has increased dramatically. In general, a power package, which includes several power semiconductor devices (e.g., chips and diodes) and assembled with different packaging technologies, provides mechanical supports, electrical interconnection, protection and thermal management to the power semiconductor devices. Correspondingly, the power package performance relies on the characteristics of the power semi-conductor devices, the packaging technology and the package configuration.

As it well known, wide band gap (WBG) devices have excellent mechanical and thermal properties, as well higher critical breakdown field in comparison to silicon chips. Owning to superior properties of the WBG device based power package over the conventional silicon based power package, the WBG device based power package has attracted extensive interests. On the other side, WBG devices can be much smaller than similarly rated silicon devices. WBG based power packages may have higher power dissipation due to higher power output and greater packaging densities, which in turn pose very big challenges in terms of thermal management. Therefore, advanced package design/structure and effective thermal management may be critical in the development of WBG device based power modules.

Conventional power modules packaging use conventional wire-bond interconnection scheme or using double-sided direct bonded coppers (DBCs) to form planar interconnection configurations on both sides of the power module. FIG. 1A is a schematic of a conventional wire-bonded power module 100a. FIG. 1B is a schematic of a conventional double-sided cooled power module 100b. The conventional structures of the power modules include series of power devices attached by different die attach material for a ground (power drain) contact on the direct bonded copper (DBC) substrate. The power source and gate pads on the power chips are interconnected to the DBC substrate by multiple bond wires. Although the conventional processes have been tried and tested for power module packaging, these conventional wire-bonded power modules have high package volume due to height of the bond wires and are also not compatible for double side cooling. Alternatively, advanced top-of-chip planar interconnection schemes, instead of bond wires, have been applied to power modules. Commonly, two DBC substrates are applied on both sides of the power devices for power drain, gate and source interconnections. Consequently, the assembled power modules have large form factor, heavy package weight and high costs due to the thick, heavy and costly DBC substrates. Moreover, the state-of-the-art power modules without additional health monitoring sensors run the risk of sudden failure, resulting in safety issues.

SUMMARY

Various embodiments may provide a semiconductor package. The semiconductor package may include a first package interconnection component. The semiconductor package may also include a second package interconnection component. The semiconductor package may further include a first electrical component between the first package interconnection component and the second package interconnection component, the first electrical component having a first side and a second side opposite the first side (of the first electrical component). The semiconductor package may also include a first bonding layer bonding the first side of the first electrical component and a first portion of the first package interconnection component. The semiconductor package may additionally include a second bonding layer bonding the second side of the first electrical component and a first portion of the second package interconnection component. The semiconductor package may further include a third bonding layer bonding a second portion of the first package interconnection component and a second portion of the second package interconnection component. The semiconductor package may also include a second electrical component having a first side and a second side opposite the first side (of the second electrical component). The semiconductor package may additionally include a fourth bonding layer bonding the first side of the second electrical component and the second portion of second package interconnection component. The semiconductor package may additionally include a first heat sink. The semiconductor package may also include a second heat sink. The semiconductor package may further include a first interface layer bonding or adhering the first heat sink and the first package interconnection component. The semiconductor package may also include a second interface layer bonding or adhering the second heat sink and the second package interconnection component.

Various embodiments may relate to a method of forming a semiconductor package. The method may include bonding a first side of a first electrical component and a first portion of a first package interconnection component via a first bonding layer. The method may also include bonding a second side of the first electrical component, the second side of the first electrical component opposite the first side (of the electrical component), and a first portion of a second package interconnection component via a second bonding layer so that the first electrical component is between the first package interconnection component and the second package interconnection component. The method may further include bonding a second portion of the first package interconnection component and a second portion of the second package interconnection component via a third bonding layer. The method may additionally include bonding a first side of a second electrical component and the second portion of second package interconnection component via a fourth bonding layer, the second electrical component also including a second side opposite the first side (of the second electrical component). The method may also include bonding or adhering a first heat sink and the first package interconnection component via a first interface layer. The method may further include bonding or adhering a second heat sink and the second package interconnection component via a second interface layer.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or semiconductor packages is analogously valid for the other methods or packages. Similarly, embodiments described in the context of a method are analogously valid for a package, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1A:
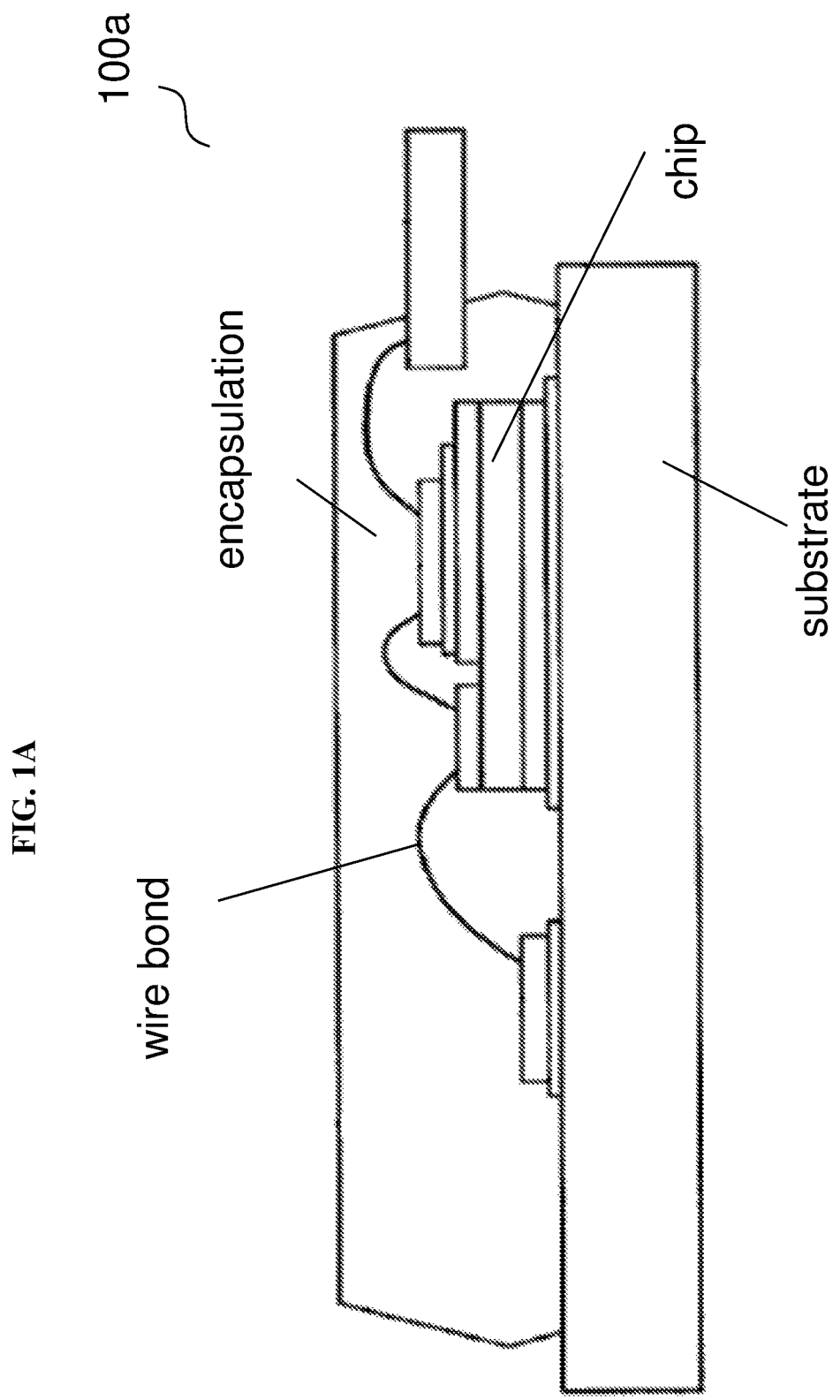
FIG. 1A is a schematic of a conventional wire-bonded power module.
Figure 1B:
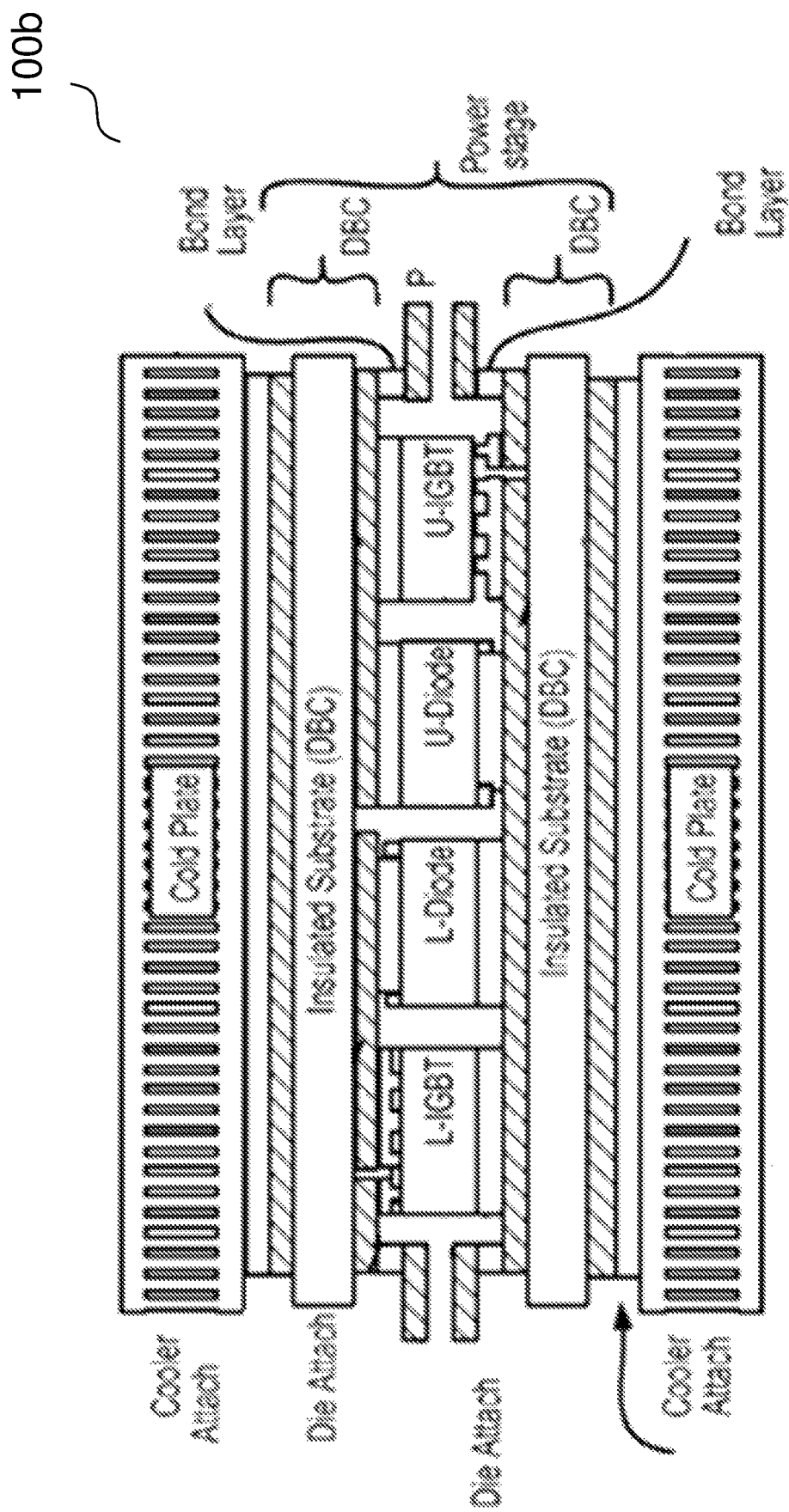
FIG. 1B is a schematic of a conventional double-sided cooled power module.
Figure 2:
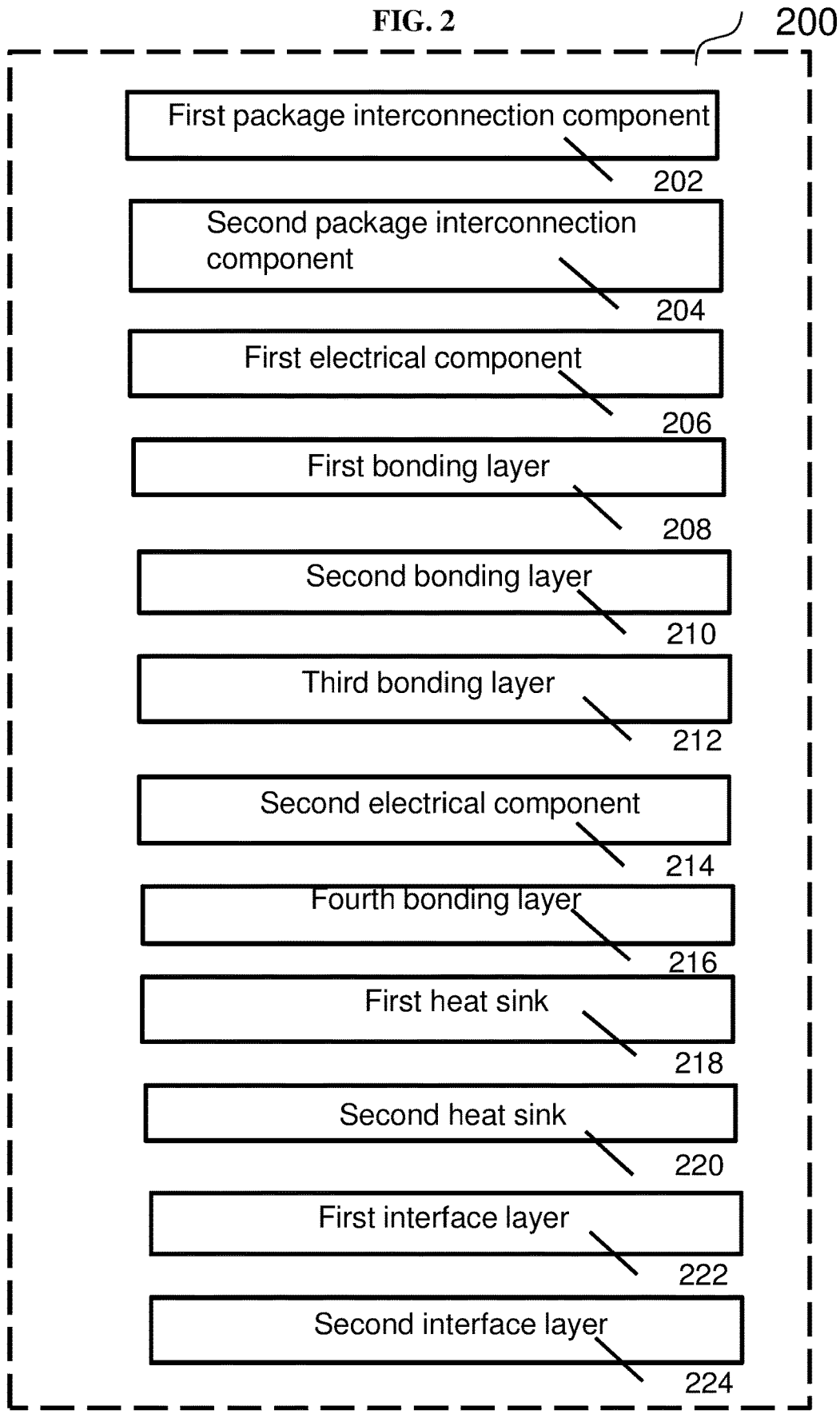
FIG. 2 is a general illustration of a semiconductor package according to various embodiments.

FIG. 2 is a general illustration of a semiconductor package 200 according to various embodiments. The semiconductor package 200 may include a first package interconnection component 202. The semiconductor package 200 may also include a second package interconnection component 204. The semiconductor package 200 may further include a first electrical component 206 between the first package interconnection component 202 and the second package interconnection component 204, the first electrical component 206 having a first side and a second side opposite the first side (of the first electrical component 206). The semiconductor package 200 may also include a first bonding layer 208 bonding the first side of the first electrical component 206 and a first portion of the first package interconnection component 202. The semiconductor package 200 may additionally include a second bonding layer 210 bonding the second side of the first electrical component 206 and a first portion of the second package interconnection component 204. The semiconductor package 200 may further include a third bonding layer 212 bonding a second portion of the first package interconnection component 202 and a second portion of the second package interconnection component 204. The semiconductor package 200 may also include a second electrical component 214 having a first side and a second side opposite the first side (of the second electrical component 214). The semiconductor package 200 may additionally include a fourth bonding layer 216 bonding the first side of the second electrical component 214 and the second portion of second package interconnection component 204. The semiconductor package 200 may additionally include a first heat sink 218. The semiconductor package 200 may also include a second heat sink 220. The semiconductor package 200 may further include a first interface layer 222 bonding or adhering the first heat sink 218 and the first package interconnection component 202. The semiconductor package 200 may also include a second interface layer 224 bonding or adhering the second heat sink 220 and the second package interconnection component 204.

In other words, the semiconductor package 200 may include the first electrical component 206, the second electrical component 204, the first heat sink 218, and the second heat sink 220. The first package interconnection component 202 and the second package interconnection component 204 may provide lateral and vertical interconnections in the package 200.

For avoidance of doubt, FIG. 2 serves to highlight the key features of a package 200 according to various embodiments, and is not intended to indicate or limit the arrangement, size, shapes, orientation etc. of the features or package 200.

The first package interconnection component 202 and the second package interconnection component 204 may provide more thermal pathways between each other, the first electrical component 206, the second electrical component 214, the first heat sink 218, and the second heat sink 220, resulting in more efficient heat dissipation. This is in addition to the function of providing electrical connections between the various components.

In various embodiments, the first electrical component 206 may be a power chip. In various embodiments, the second electrical component 214 may be a temperature sensor and/or a current sensor. The first electrical component 206 may be or may include a wide bandgap device, such as a silicon carbide (SiC) device. Silicon carbide may have a wide bandgap of about 3 eV. The wide bandgap device may instead, for example, be a gallium nitride (GaN) device, or a gallium oxide ($Ga_2O_3$) device.

In various embodiments, the first package interconnection component 202 may be a lead frame (e.g. a copper lead frame) or a flexible printed circuit (FPC). In various embodiments, the second package interconnection component 204 may be a lead frame (e.g. a copper lead frame) or a flexible printed circuit (FPC). A copper lead frame or lead frame as described herein may include a surface finishing of nickel (Ni), nickel/palladium (Ni/Pd), or nickel/palladium/silver (Ni/Pd/Ag). The surface finishing may be used for Ag sintering and Cu sintering bonding.

The second package interconnection component 204 may be bent to define the first portion, the second portion, and an intervening portion between the first portion and the second portion. The intervening portion of the second package interconnection component 204 may be perpendicular to the first portion of the second package interconnection component 204, and also perpendicular to the second portion of the second package interconnection component.

In various embodiments, the semiconductor package 200 may also include a third package interconnection component. The semiconductor package 200 may further include a fifth bonding layer bonding the second side of the second electrical component 214 and a first portion of the third package interconnection component so that the second electrical component 214 is between the second package interconnection component 204 and the third package interconnection component. The semiconductor package 200 may additionally include a sixth bonding layer bonding a second portion of the third package interconnection component and a third portion of the first package interconnection component 202.

The third package interconnection component may be bent to define the first portion, the second portion, and an intervening portion between the first portion and the second portion. The intervening portion of the third package interconnection component may be perpendicular to the first portion of the third package interconnection component, and also perpendicular to the second portion of the third package interconnection component.

The first interface layer 222 and/or the second interface layer 224 may include a dielectric material. In various embodiments, the dielectric material may be or may include a coated polyimide material with nano-fillers. In various other embodiments, the first interface layer and the second interface layer may each be or may each include an aluminum oxide ($Al_2O_3$) aerosol deposition layer and a coated layer including polyimide material.

The semiconductor package 200 may also include a mold encapsulation covering at least a portion of the first electrical component 206 and at least a portion of the second electrical component 214.

In various embodiments, the semiconductor package 200 may also include one or more further electrical components between the first package interconnection component 202 and the second package interconnection component 204. The one or more further electrical components may include a Schottky barrier diode. The one or more further electrical components may be wide band gap device(s).

In various embodiments, the semiconductor package 200 may be referred to as a power module or an intelligent power module.

Figure 3:
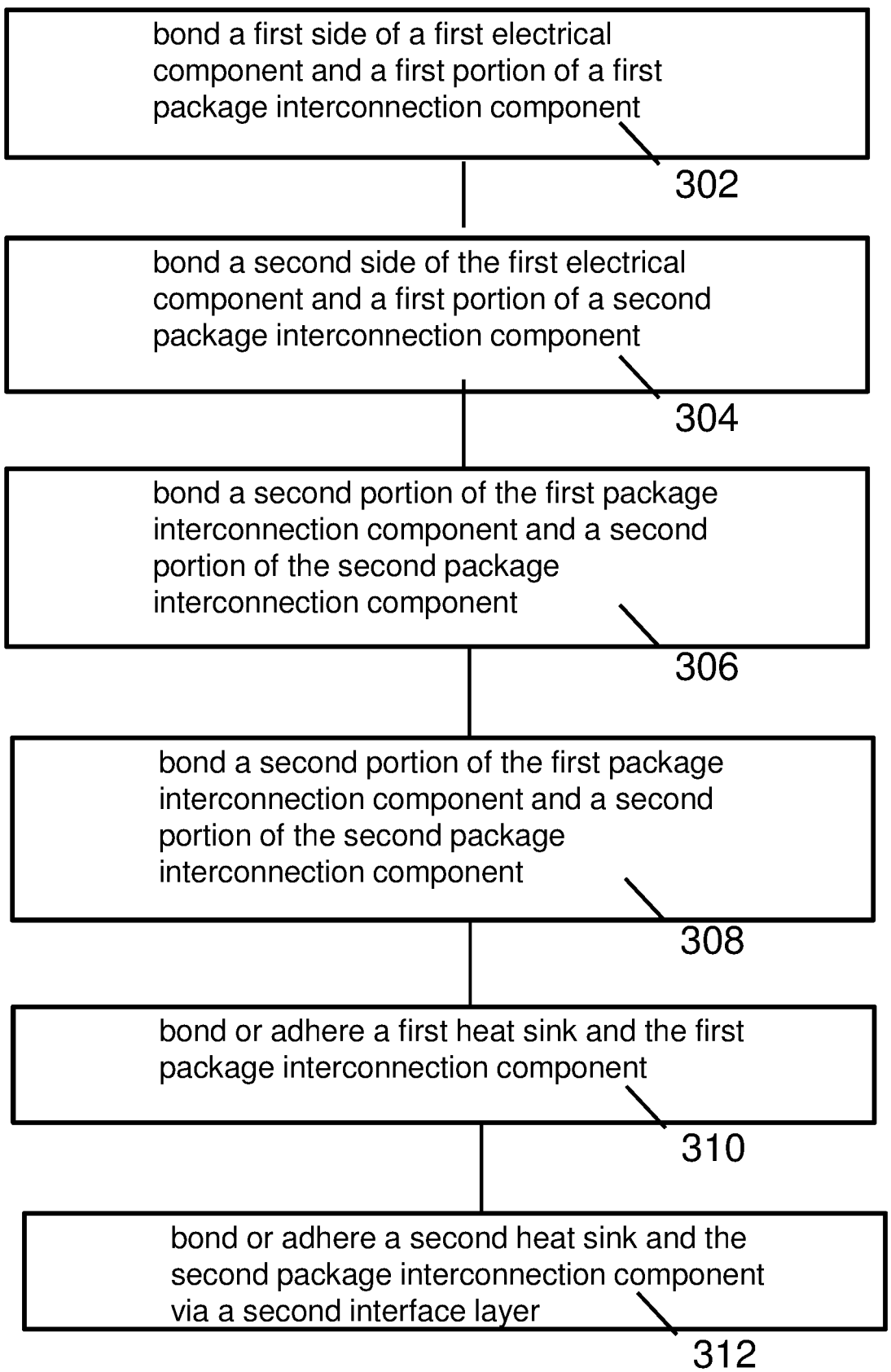
FIG. 3 is a general illustration of a method of forming a semiconductor package according to various embodiments.

FIG. 3 is a general illustration of a method of forming a semiconductor package according to various embodiments. The method may include, in 302, bonding a first side of a first electrical component and a first portion of a first package interconnection component via a first bonding layer. The method may also include, in 304, bonding a second side of the first electrical component, the second side of the first electrical component opposite the first side (of the electrical component), and a first portion of a second package interconnection component via a second bonding layer so that the first electrical component is between the first package interconnection component and the second package interconnection component. The method may further include, in 306, bonding a second portion of the first package interconnection component and a second portion of the second package interconnection component via a third bonding layer. The method may additionally include, in 308, bonding a first side of a second electrical component and the second portion of second package interconnection component via a fourth bonding layer, the second electrical component also including a second side opposite the first side (of the second electrical component). The method may also include, in 310, bonding or adhering a first heat sink and the first package interconnection component via a first interface layer. The method may further include, in 312, bonding or adhering a second heat sink and the second package interconnection component via a second interface layer.

In other words, the method may include bonding the first electrical component and the second electrical component to the first package interconnection component and the second package interconnection component. The method may also include bonding the first heat sink and the first package interconnection component, as well as the second heat sink and the second package interconnection component.

For avoidance of doubt, FIG. 3 seeks to highlight the steps of a forming a semiconductor package according to various embodiments. The steps may or may not be in sequence. For instance, step 302 may be before step 304, after step 304, or may occur at the same time as step 304.

In various embodiments, the first electrical component may be a power chip. The second electrical component may be a temperature sensor and/or a current sensor.

The first package interconnection component may be a lead frame or a flexible printed circuit (FPC). The second package interconnection component may be a lead frame or a flexible printed circuit (FPC).

In various embodiments, the method may also include bonding the second side of the second electrical component and a first portion of a third package interconnection component via a fifth bonding layer so that the second electrical component is between the second package interconnection component and the third package interconnection component. The method may further include bonding a second portion of the third package interconnection component and a third portion of the first package interconnection component via a sixth bonding layer.

In various embodiments, the second side of the second electrical component may be bonded with the first portion of the third package interconnection component before the first side of the second electrical component is bonded with the second portion of second package interconnection component.

In various embodiments, the first side of the second electrical component may be bonded with the second portion of second package interconnection component before the second side of the second electrical component is bonded with the first portion of the third package interconnection component.

In various embodiments, the method may also include forming a mold encapsulation to cover at least a portion of the first electrical component and at least a portion of the second electrical component.

In various embodiments, the method may additionally include providing one or more further electrical components between the first package interconnection component and the second package interconnection component.

Various embodiments may relate to a structure for the power module. First, power devices (e.g. chips, diodes) are bonded to the 3D copper lead frames (which is with surface finishing of Ni, or Ni/Pd, or Ni/Pd/Ag for Ag sintering and Cu sintering bonding) or FPC to form the lateral and vertical interconnections for power drain, gate and source pads. Two liquid cooled heat sinks may be integrated with the power module on both sides through the adhesive, coated dielectric material to construct the double side cooling scheme for the power module. Furthermore, real-time monitoring sensors (e.g. temperature sensor and current sensor) may be embedded in the power modules and may be linked with the power chips through 3D lead frame as a bridge to enhance the reliability features of the power module. Therefore, the silicon carbide (SiC) power module may have enhanced thermal performance, smaller form factor, lighter weight, lower cost and more reliable features as compare with the state of the art power modules.

Figure 4A:
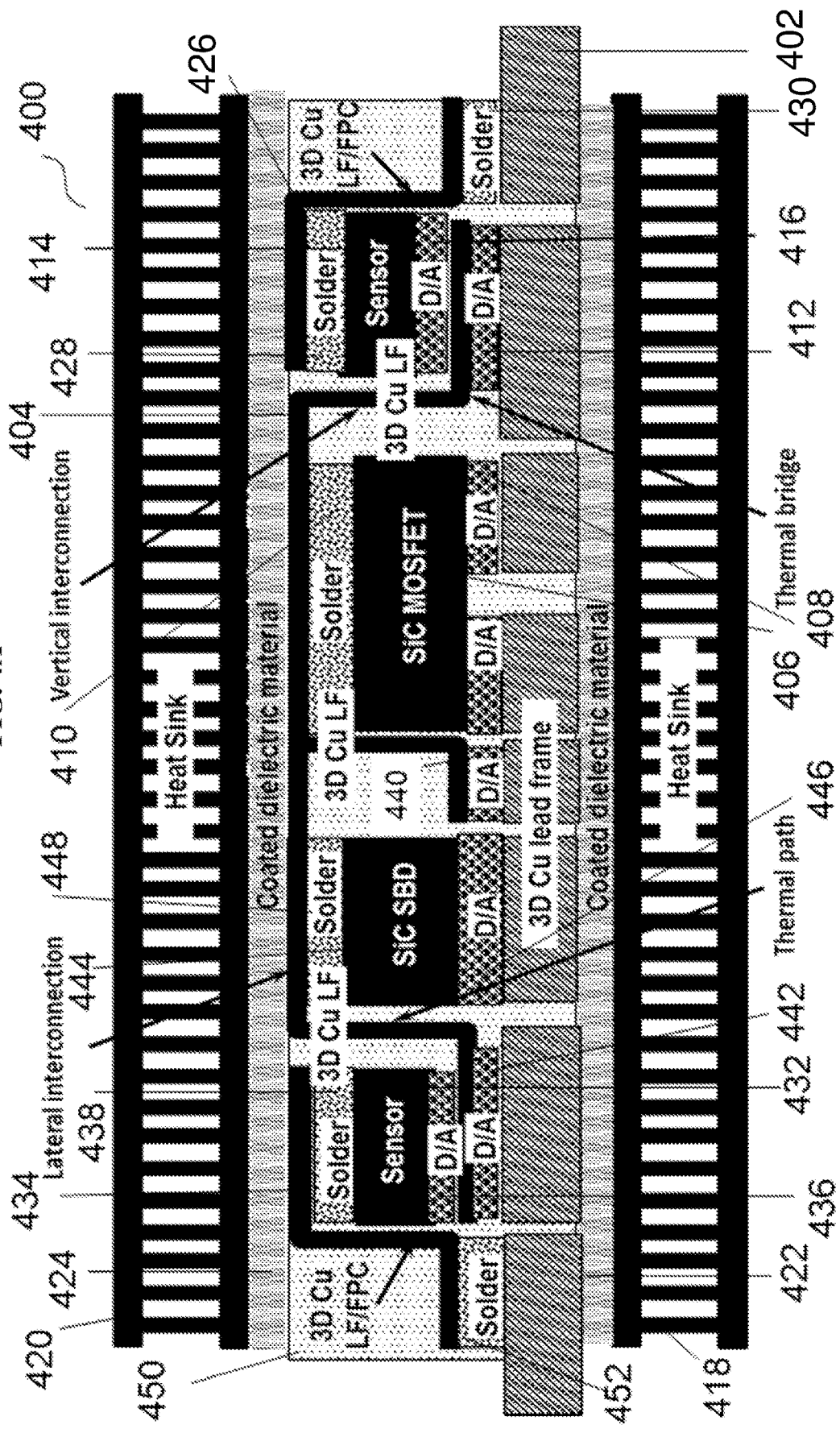
FIG. 4A is schematic showing a cross-sectional view of a semiconductor package or power module according to various embodiments.

FIG. 4A is schematic showing a cross-sectional view of a semiconductor package or power module 400 according to various embodiments.

The semiconductor package 400 may include a first package interconnection component 402, i.e. a bottom side three-dimensional (3D) copper (Cu) lead frame (LF) or flexible printed circuit (FPC). The semiconductor package 400 may also include a second package interconnection component 404, i.e. a top side three-dimensional (3D) copper (Cu) lead frame (LF) or flexible printed circuit (FPC). The top side three-dimensional (3D) copper (Cu) lead frame (LF) or flexible printed circuit (FPC) 404 may be bent to define a first portion, a second portion, and an intervening portion between the first portion and the second portion. The bottom side 3D Cu LF or FPC 402 may also include a first portion and a second portion.

The semiconductor package 400 may further include a first electrical component 406, e.g. a silicon carbide (SiC) metal oxide semiconductor field effect transistor (MOSFET), between the bottom side 3D Cu LF or FPC 402 and the top side 3D Cu LF or FPC 404. The MOSFET 406 may have a first side and a second side opposite the first side. The semiconductor package 400 may also include a first bonding layer 408, e.g. a die attach (D/A) material, bonding the first side of the first electrical component 406 and the first portion of the bottom side 3D Cu LF or FPC 402. The semiconductor package 400 may additionally include a second bonding layer 410, e.g. a solder layer, bonding the second side of the MOSFET 406 and the first portion of the top side 3D Cu LF or FPC 404. The semiconductor package 400 may further include a third bonding layer 412 (e.g. a D/A material) bonding the second portion of the bottom side 3D Cu LF or FPC 402 and the second portion of the top side 3D Cu LF or FPC 404. The semiconductor package 400 may also include a second electrical component 414, e.g. a sensor such as a temperature sensor or current sensor, having a first side and a second side opposite the first side. The semiconductor package 400 may additionally include a fourth bonding layer 416, e.g. a solder layer, bonding the first side of the sensor 414 and the second portion of the top side 3D Cu LF or FPC 404. The semiconductor package 400 may additionally include a first heat sink 418. The semiconductor package 400 may also include a second heat sink 420. The semiconductor package 400 may further include a first interface layer 422 bonding the first heat sink 418 and the bottom side 3D Cu LF or FPC 402. The semiconductor package 400 may also include a second interface layer 424 bonding the second heat sink 420 and the top side 3D Cu LF or FPC 404.

The semiconductor package 400 may further include a third package interconnection component 426, i.e. a 3D Cu LF or FPC. The package 400 may also include a fifth bonding layer 428, e.g. a solder layer, bonding the sensor 414 and a first portion of the 3D Cu lead frame or FPC 426 so that the sensor 414 is between LF or FPC 404 and LF or FPC 426. A sixth bonding layer 430, e.g. a solder layer, may bond a second portion of the 3D Cu LF or FPC 426 and a third portion of the 3D Cu LF or FPC 402.

The package 400 may further include a third electrical component 432, e.g. a further sensor and a fourth package interconnection component 434, i.e. a 3D Cu LF or FPC. The further sensor 432 may be between the 3D Cu LF or FPC 434 and the 3D Cu LF or FPC 404. A bonding layer 436 may bond the first side of the further sensor 432 to the 3D Cu LF or FPC 404, while another bonding layer 438 may bond the second side of the further sensor 432 to the 3D Cu LF or FPC 434. The 3D Cu LF or FPC 404 and the 3D Cu LF or FPC 402 may also be bonded by bonding layers 440, 442, e.g. D/A material.

The package 400 may also include an electrical component 444 such as a Schottky barrier diode (SBD). The package 400 may also include a bonding layer 446, e.g. D/A material, bonding the component 444 to the 3D Cu LF or FPC 402. The package 400 may further include a bonding layer 448, e.g. a solder layer 448, bonding the component 444 to the 3D Cu LF or FPC 404.

The package 400 may also include a mold encapsulation 450 covering at least a portion of the MOSFET 406, sensors 414, 432, and SBD 444. Bonding layer 452 may bond the 3D Cu LF or FPC 434 to the 3D Cu LF or FPC 402.

The package 400 may generally include semiconductor devices such as bare chips, diodes and temperature/current sensors. Other passive components may also be integrated as needed. These multiple chips/sensors may be integrated by attaching them to a 3D copper lead frame (Cu LF) or a flexible printed circuit (FPC) 402 at the bottom side and forming the drain interconnection. Another top 3D copper lead frame (Cu LF) or flexible printed circuit FPC 404 may be introduced to form lateral and vertical interconnections for gate and source pads. Meanwhile, the top lead frame or FPC 404 may also form thermal bridges between the power chips and sensors to reduce the temperature difference between the chips and sensors. Consequently, the sensors may sense the temperature of the power chips more accurately. An encapsulation 450 including high temperature endurable molding compound may be utilized for the power module 400. In the module 400, liquid cooled heat sinks 418, 420 may be integrated with the power module 400 on both sides with the coated dielectric material 422, 424 to construct the double side cooling scheme for the package 400. Furthermore, real-time health monitoring sensors (e.g. temperature sensor and current sensor) may be integrated into the power modules to enhance the reliability features of the power module. Therefore, the power module may have a smaller form factor, may have a lighter weight, may be of a lower cost, may have more reliable features and may have better performance as compare with the state-of-the-art power modules 400.

Figure 4B:
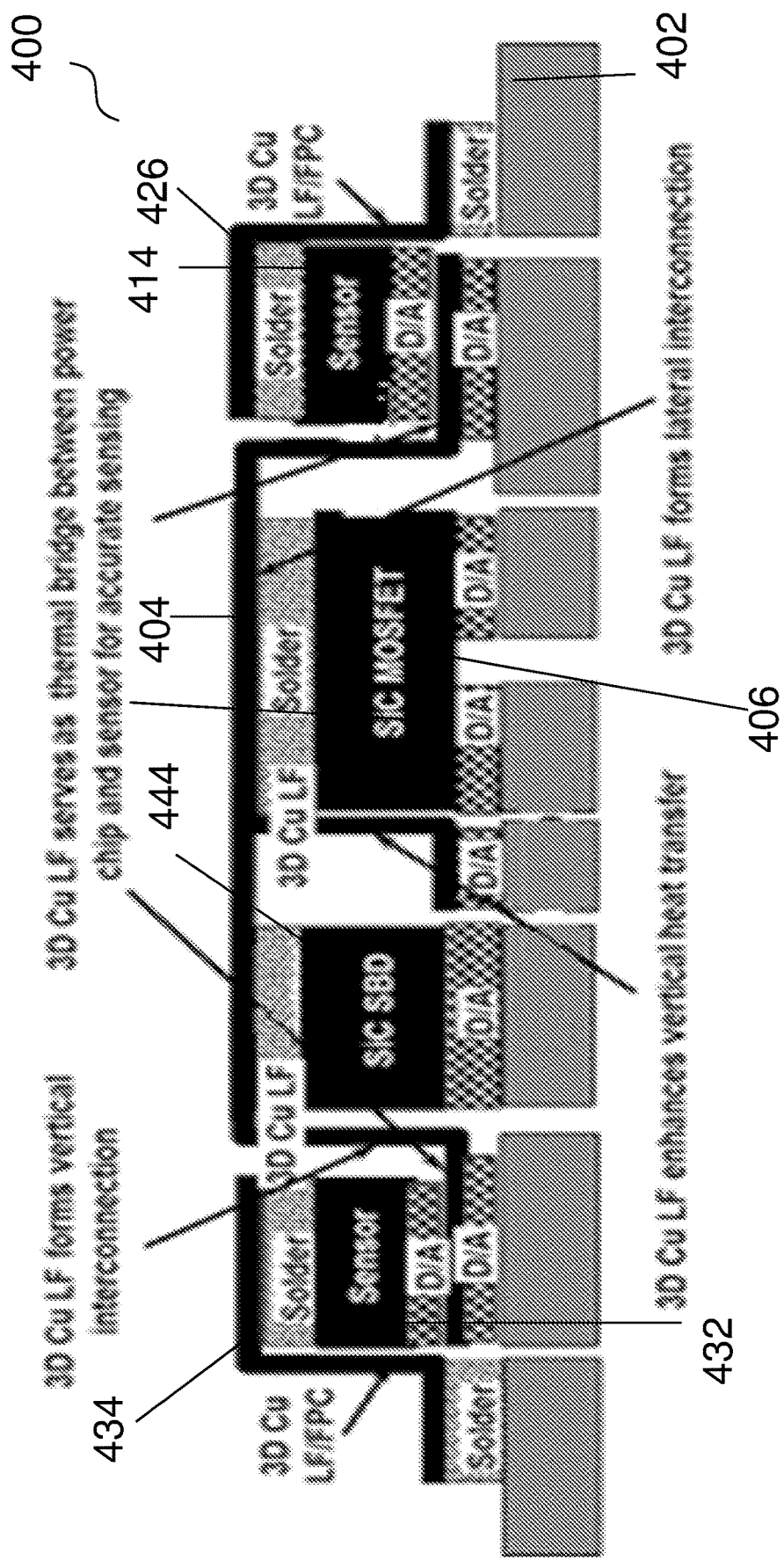
FIG. 4B is schematic showing a cross-sectional view of a portion of the semiconductor package or power module shown in FIG. 4A according to various embodiments.

FIG. 4B is schematic showing a cross-sectional view of a portion of the semiconductor package or power module 400 shown in FIG. 4A according to various embodiments.

As shown in FIG. 4B, the 3D LFs or FPCs 404, 426, 434 may form lateral electrical interconnections as well as vertical interconnections and couple multiple chips. Moreover, the 3D LFs or FPCs 404, 426, 434 may serve as the vertical thermal paths between the top and bottom of the package or module 400, and thermal bridge between the power chips or devices 406, 444 and sensors 414, 432.

Figure 4C:
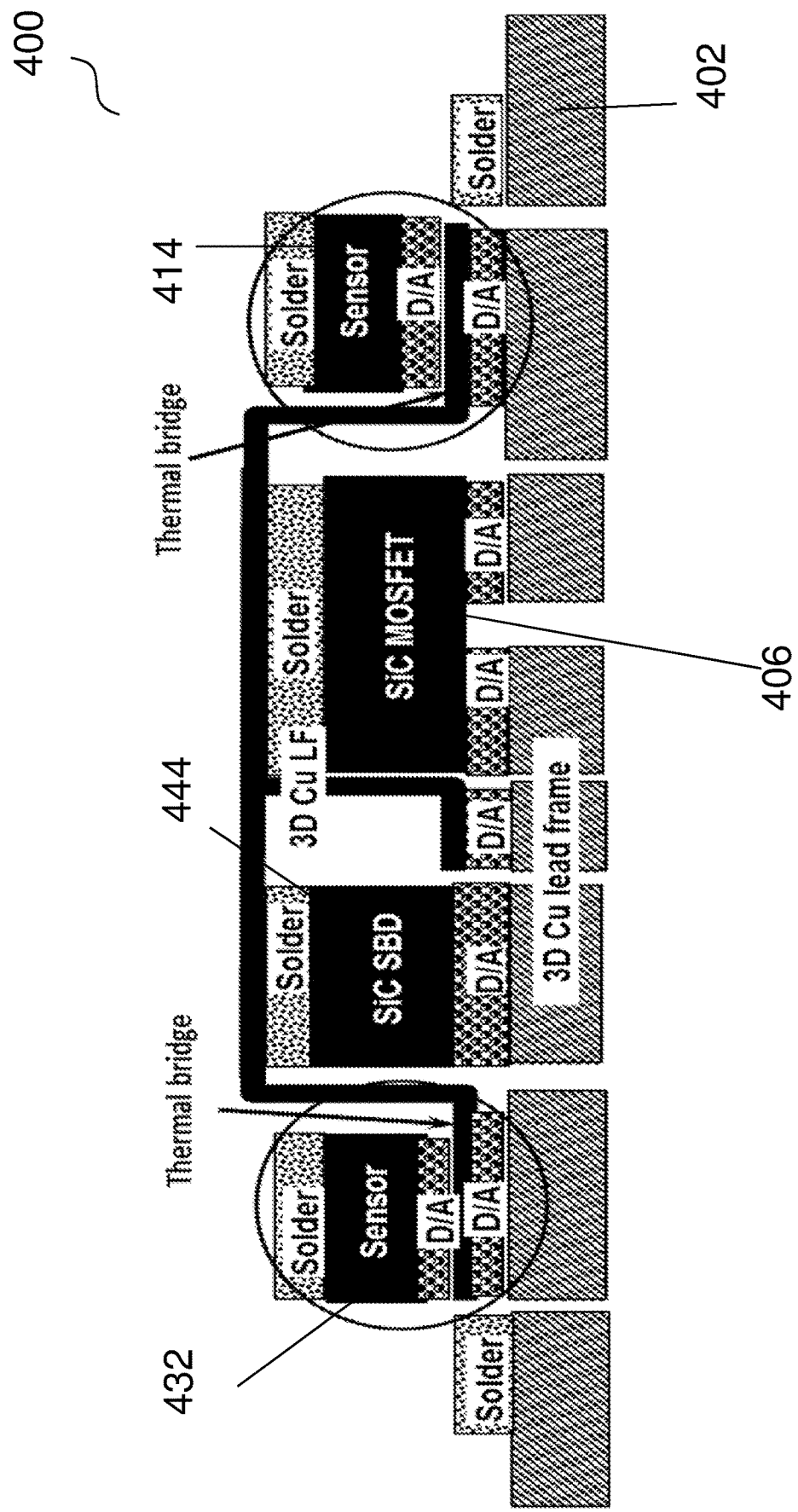
FIG. 4C is schematic showing a cross-sectional view of a portion of the semiconductor package or power module shown in FIG. 4A according to various embodiments.

FIG. 4C is schematic showing a cross-sectional view of a portion of the semiconductor package or power module 400 shown in FIG. 4A according to various embodiments. FIG. 4C shows how sensors 414, 432 are coupled with the power chips or devices 406, 444. The 3D LFs or FPCs 402, 404, 426, 434 may serve as thermal bridges between the sensors 414, 432 and the power chip 406. Hence, the temperature difference between the power chip or devices 406, 444 and the sensors 414, 432 may be reduced by utilizing these thermal bridges, as such sensors 414, 432 sense the temperature of the power chips more accurately.

Figure 5A:
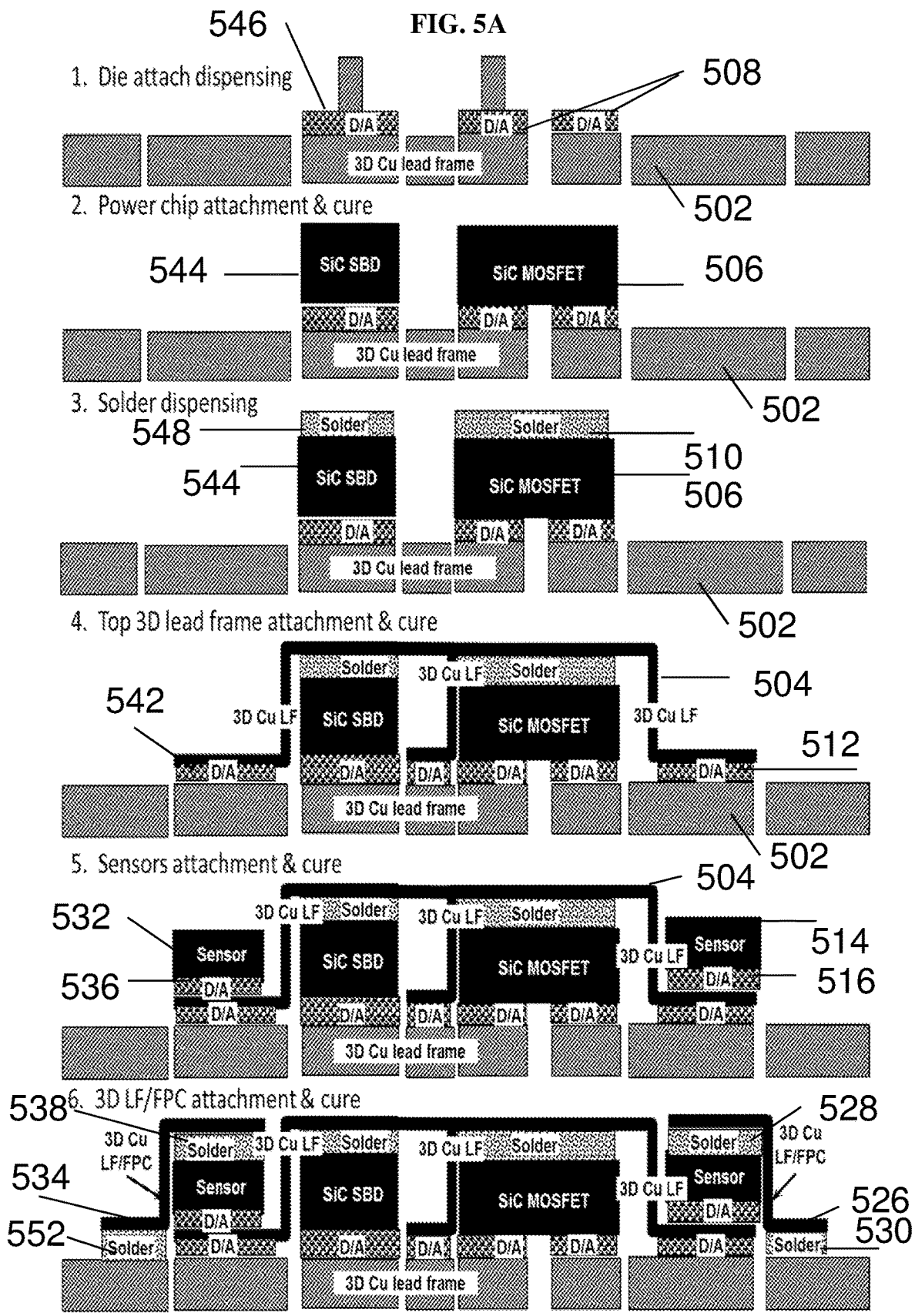
FIG. 5A shows a schematic of forming a semiconductor package or power module according to various embodiments.
Figure 5B:
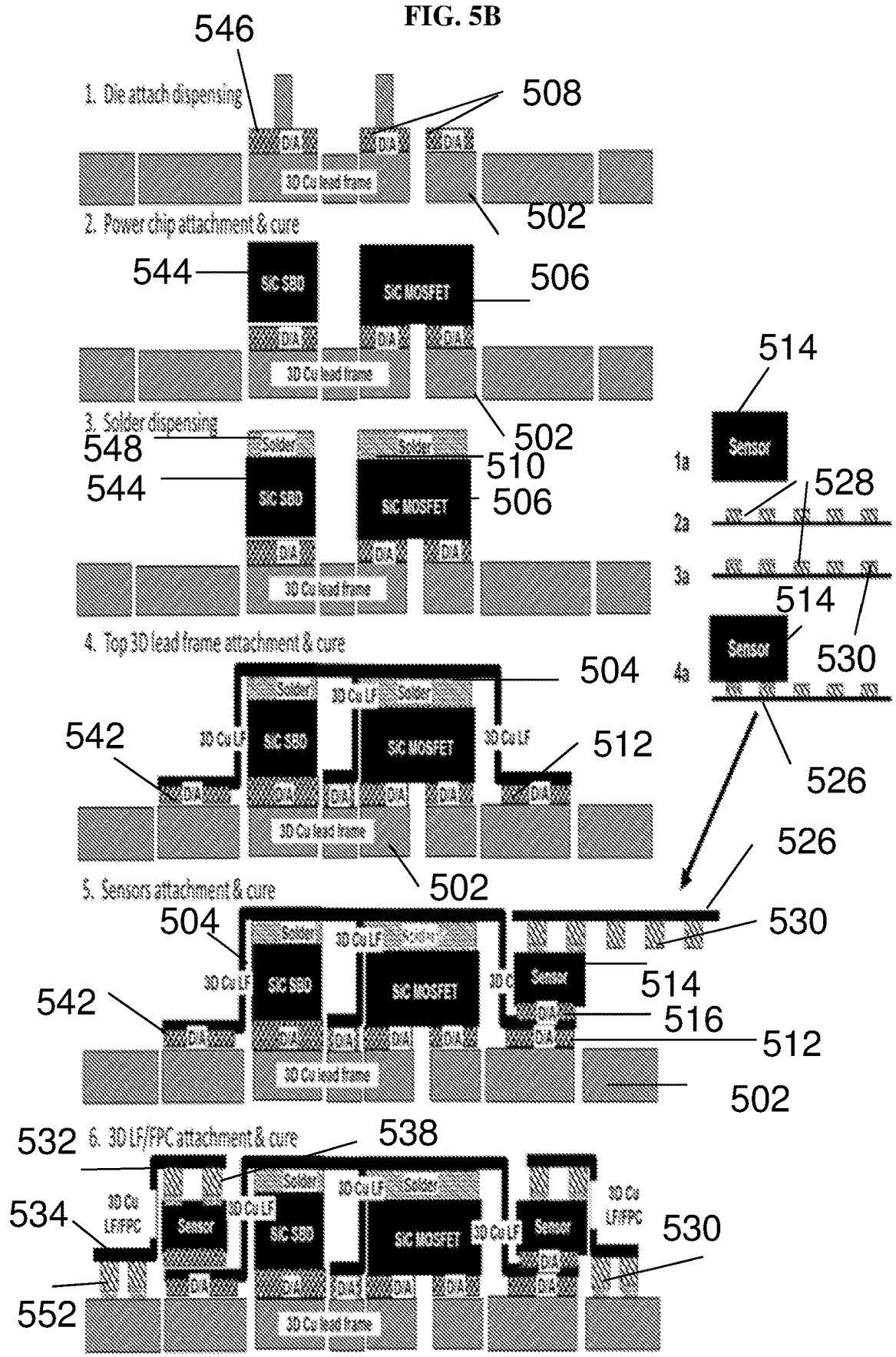
FIG. 5B shows a schematic of forming a semiconductor package or power module according to various other embodiments.
Figure 5C:
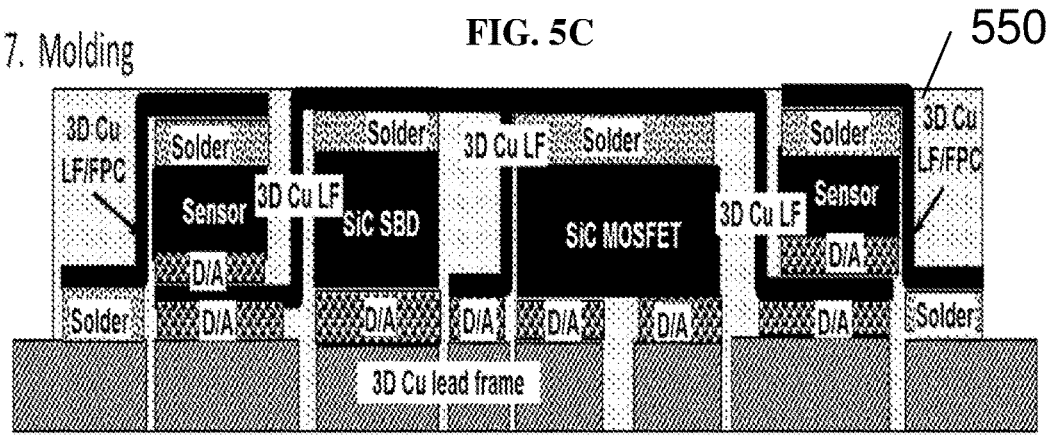
FIG. 5C shows a schematic of forming the semiconductor package or power module after the process shown in FIG. 5A or after the process shown in FIG. 5B according to various embodiments.
Figure 5C:
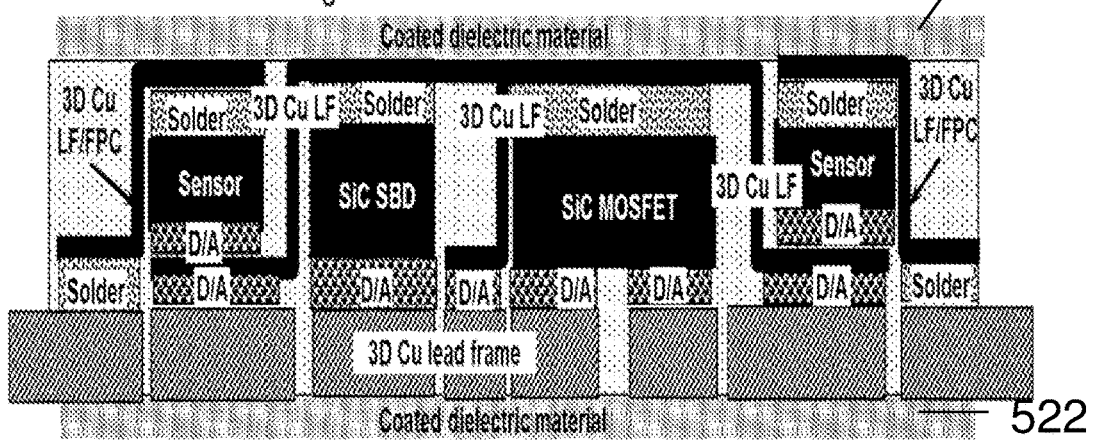
Figure 5C:
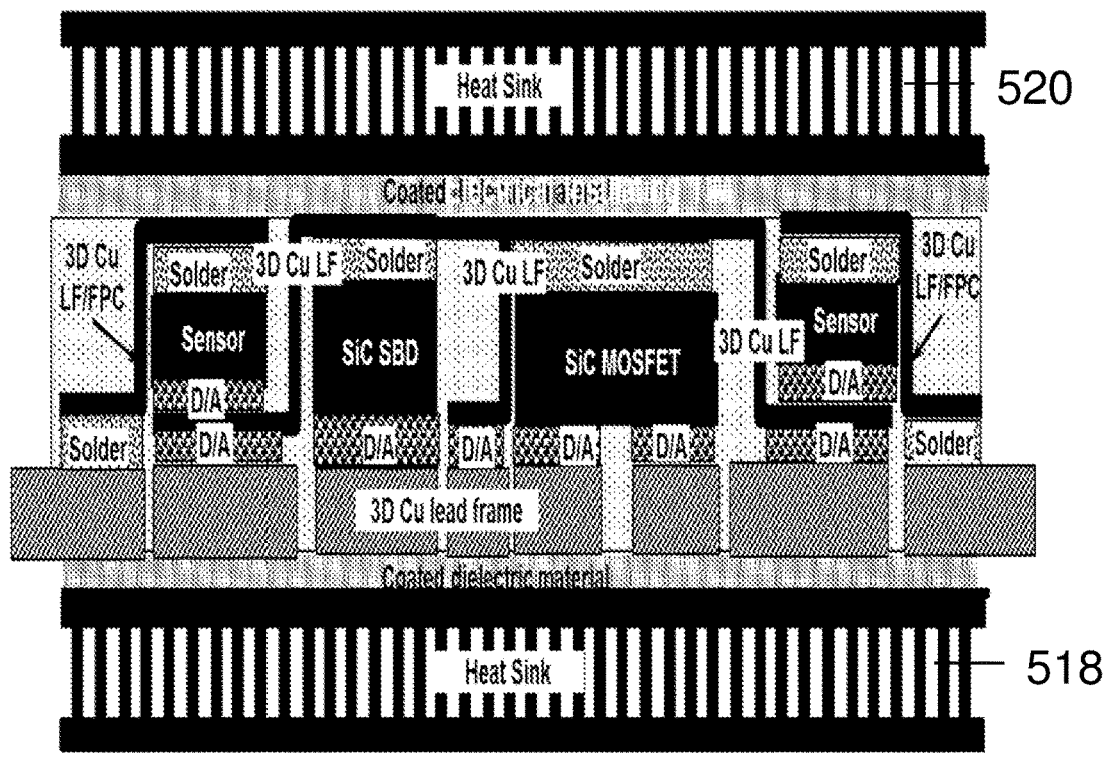

FIG. 5A-5C show various processes of forming the semiconductor package or power module as shown in FIG. 4A. In order to avoid clutter and improve clarity, not all elements of the same feature have been labelled.

FIG. 5A shows a schematic of forming a semiconductor package or power module according to various embodiments. FIG. 5B shows a schematic of forming a semiconductor package or power module according to various other embodiments. FIGS. 5A-B illustrate alternative parts of an integrated process flow of packages or modules with embedded health sensing devices and dual side cooling capabilities.

The first four steps of FIGS. 5A-B may be similar. Step 1 in both FIGS. 5A-B illustrates dispensing die attach (D/A) material to form bonding layers 508, 546 on a first package interconnection component 502, such as a 3D copper (Cu) lead frame (LF) or flexible printed circuit (FPC). Step 2 in both FIGS. 5A-B relates to attaching power devices such as a silicon carbide (SiC) metal oxide field effect transistor (MOSFET) chip 506 and a silicon carbide (SiC) Schottky barrier diode (SBD) chip 544 to the LF 502 via bonding layers 508, 546 respectively, and curing the die attach material included in the bonding layers 508, 546. Step 3 in both FIGS. 5A-B shows dispensing solder material on the power devices 506, 544 and LF (or FPC) 502. Bonding layer 510 may be formed on power device 506, and bonding layer 548 may be formed on power device 544. Step 4 in both FIGS. 5A-B illustrates attaching a second package interconnection component 504, such as a 3D Cu LF or FPC, as well as subsequent curing of the solder material. As shown in FIGS. 5A-B, the 3D Cu LF (or FPC) 504 may form an inverted U-shape. The curing may bond the 3D Cu LF 504 to the power device 544 via bonding layer 548, and may bond the 3D Cu LF 504 to the power device 544 via bonding layer 510. The curing may also bond the 3D Cu LFs 502, 504 together via bonding layers 512, 542.

Step 5 of FIG. 5A shows attaching of sensor 532 to the Cu LF (or FPC) 504 via bonding layer 536 (including e.g. die attach material such as Ag/Cu sintering paste or High Temperature Solder), and attaching of sensor 514 to the Cu LF (or FPC) 504 via bonding layer 516 (including e.g. die attach material). Step 6 of FIG. 5A shows bonding of 3D Cu LF (or FPC) 534 to sensor 532 via bonding layer 538 (including e.g. solder material) and bonding of 3D Cu LF (or FPC) 526 to sensor 514 via bonding layer 528 (including e.g. solder material). The 3D Cu LF (or FPC) 534 may be bonded to Cu LF (or FPC) 502 via bonding layer 552 (including solder material), and the 3D Cu LF (or FPC) 526 may be bonded to Cu LF (or FPC) 502 via bonding layer 530 (including solder material).

Steps 1a-4a of FIG. 5B show bonding of sensor 514 to 3D Cu LF (or FPC) 526 via bonding layer 528. Bonding layer 530 may also be deposited on the 3D Cu LF (or FPC) 526. Step 5 of FIG. 5A shows bonding of the bonded assembly shown in Step 4a to the 3D Cu LF (or FPC) 504 via bonding layer 516. Step 6 of FIG. 5A shows bonding of the bonded assembly to Cu LF (or FPC) 502 via the bonding layer 530. The sensor 532 may be bonded to 3D Cu LF (or FPC) 534 via bonding layer 538, while the 3D Cu LF (or FPC) 534 may be bonded to Cu LF (or FPC) 502 via bonding layer 552 in a similar manner.

FIG. 5C shows a schematic of forming the semiconductor package or power module after the process shown in FIG. 5A or after the process shown in FIG. 5B according to various embodiments. Step 7 shows deposition of a high temperature mold compound, followed by curing to form mold encapsulation 550. Step 8 shows coating layers 522, 524 of dielectric materials on both sides of the package or module. Step 9 shows the integration of heat sinks 518, 520.

Figure 6A:
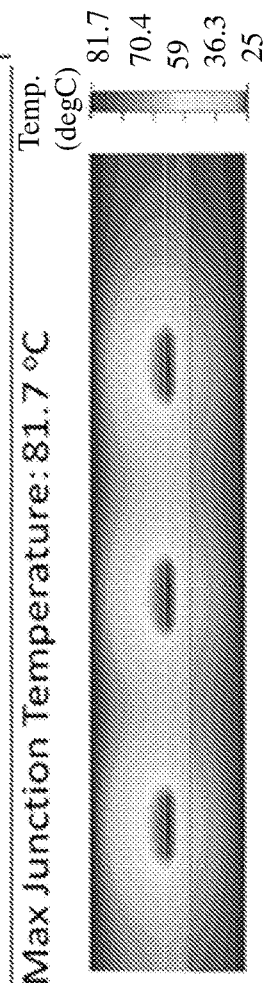
FIG. 6A is a table showing the simulated maximum junction temperatures for the conventional silicon carbide (SiC) power module, the state-of-the-art emerged silicon carbide (SiC) power module, and an embodiment of the present invention.
Figure 6A:
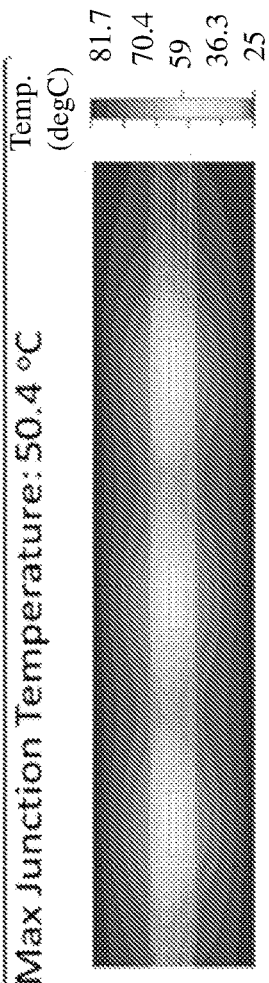
Figure 6A:
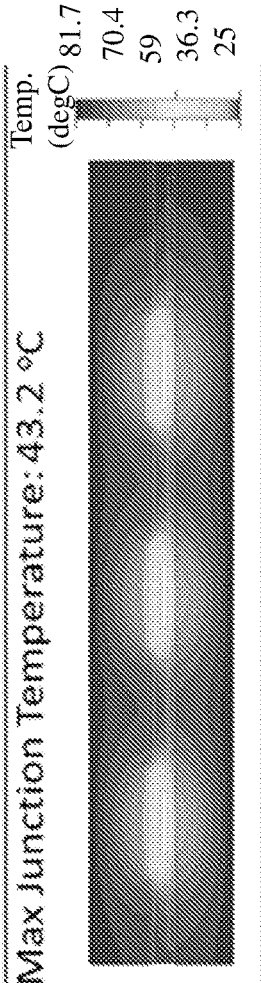
Figure 6A:
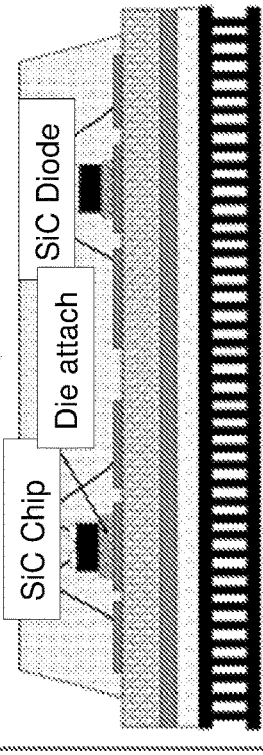
Figure 6A:
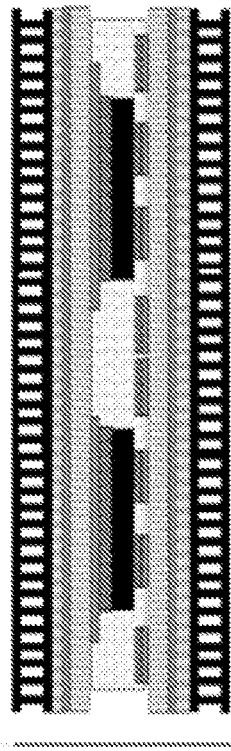
Figure 6A:
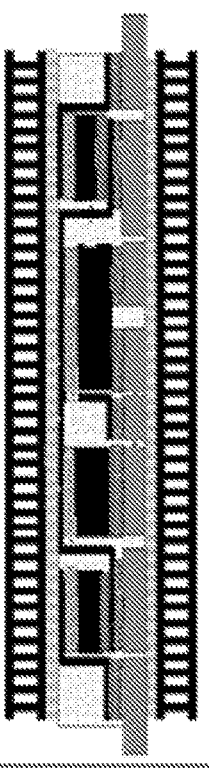
Figure 6B:
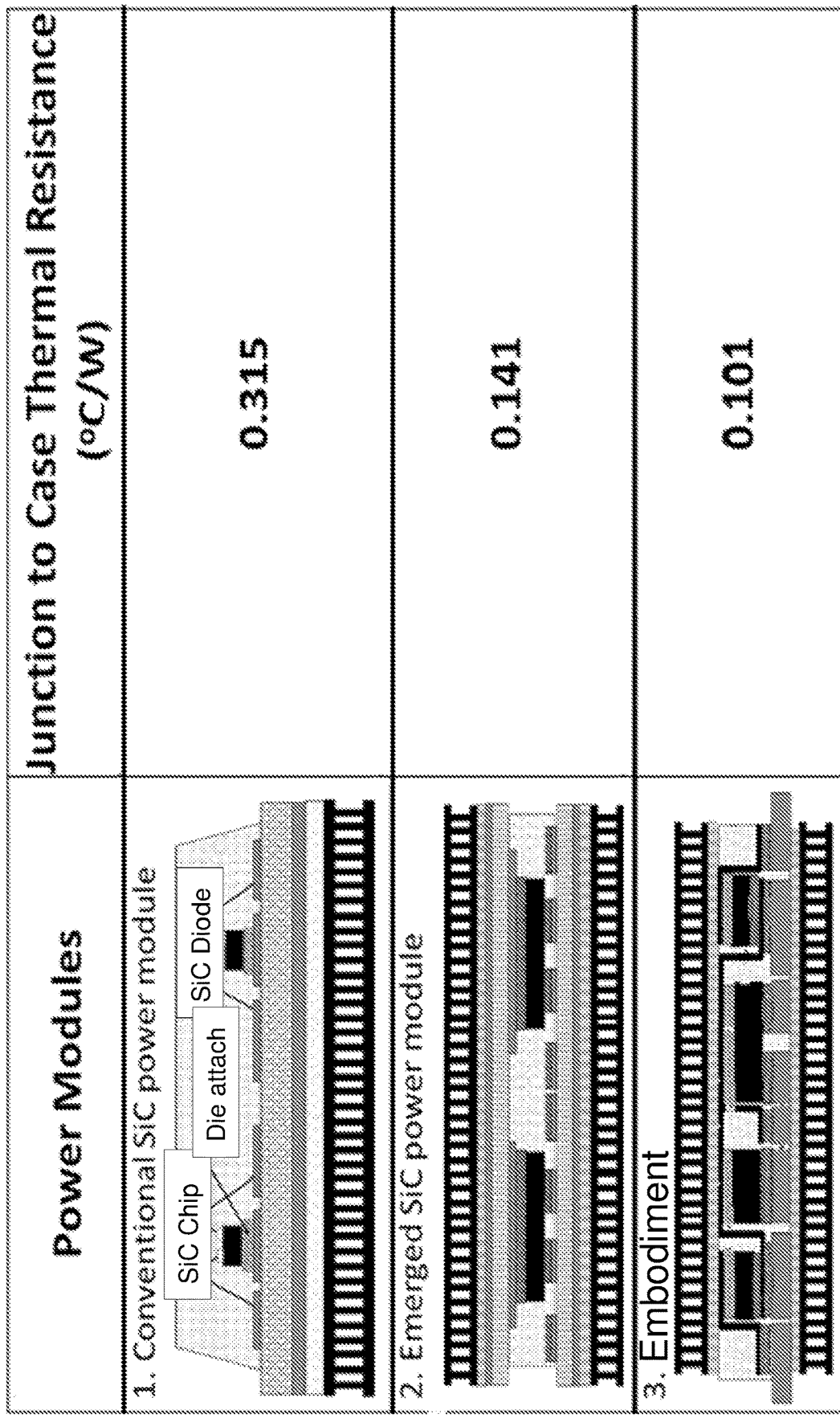
FIG. 6B is a table showing the junction to case thermal resistances (in degree Celsius per Watt or ° C./W) for the conventional silicon carbide (SiC) power module, the state-of-the-art emerged silicon carbide (SiC) power module, and the embodiment of the present invention.

In order to evaluate the thermal performance of the power module as described herein, a 3D thermal model may be created to simulate the temperature distribution in the power module. In order to make a comparison, thermal modeling of a conventional wire-bonded power module and a state-of-the-art power module may also be done for thermal performance evaluation. The same chip size, same substrate size, same package size and same power rates are assumed for the all of the three types of power modules for fair comparison. FIG. 6A is a table showing the simulated maximum junction temperatures for the conventional silicon carbide (SiC) power module, the state-of-the-art emerged silicon carbide (SiC) power module, and an embodiment of the present invention. FIG. 6B is a table showing the junction to case thermal resistances (in degree Celsius per Watt or °C./W) for the conventional silicon carbide (SiC) power module, the state-of-the-art emerged silicon carbide (SiC) power module, and the embodiment of the present invention.

FIG. 6A reveals that the maximum chip junction temperature of the conventional power module is ~81.7° C., while the maximum chip junction temperature of the state-of-the-art emerged power module is ~50.4° C. and maximum chip junction temperature for the proposed power module is ~43.2° C. Furthermore, FIG. 6B also shows that the junction to case thermal resistance (Theta JC) of the proposed module (~0.101° C./W) is about ~68% less than the thermal resistance (Theta JC) of the conventional power module (~0.315° C./W). Further, comparing the proposed power module with the emerged power module, the thermal resistance (Theta JC) of the proposed power package (~0.101° C./W) is about 30% less than the thermal resistance (Theta JC) of the emerged power module (~0.141° C./W). The simulation results indicate that there may be significant enhancement of the thermal performance of the proposed power module as compared with those of the conventional and emerged power modules.

Figure 6C:
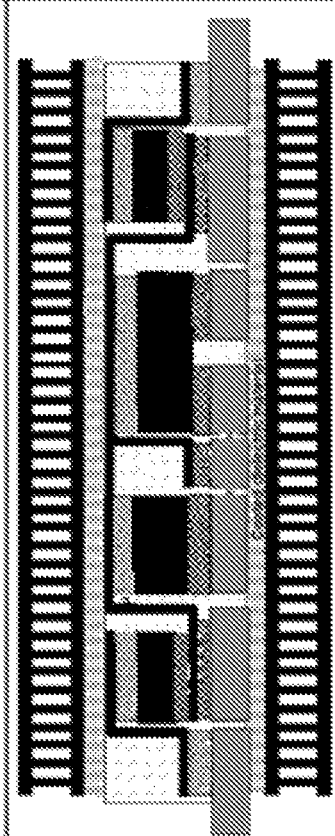
FIG. 6C is a table illustrating the temperature uniformity of (right) an embodiment of the power module, and (left) an alternative integration for the power chip and sensor integration.
Figure 6C:
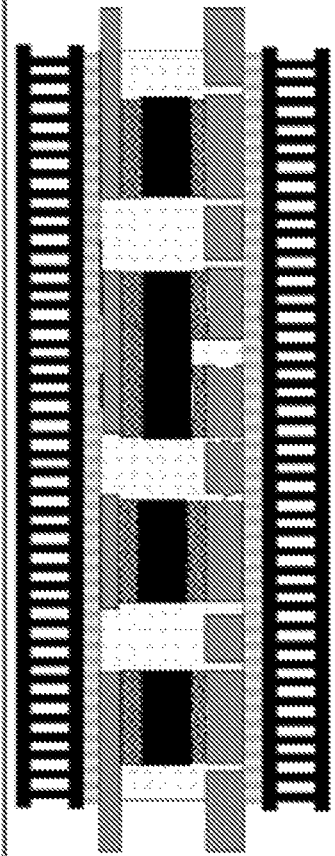

FIG. 6C is a table illustrating the temperature uniformity of (right) an embodiment of the power module, and (left) an alternative integration for the power chip and sensor integration. A more uniform temperature between the sensor and power chips may result in more accurate temperature sensing. It can be seen from FIG. 6C that the temperature difference between the sensor and power chip is 10° C. for the embodiment, while the temperature difference between the sensor and power chip is 27° C. for other possible integration scheme under same design parameters and assembly conditions. The result highlights the advantages of various embodiments for accurate temperature sensing.

Various embodiments may relate to a double side cooled intelligent power module assembled with 3D copper lead frames, which couple multiple chips, forming both lateral and vertical interconnections, and which serve as thermal bridges between the power chips and sensors. The 3D lead frame may also act as thermal paths through the top and bottom of the power module to enhance the thermal management.

Various embodiments may include double side cooling heat sinks integrated with the power module through the adhesive, coated dielectric material. No additional bonding or clamping may be required.

Monitoring sensors may be embedded into the power modules and may be linked with the power chips through the 3D lead frame, which may act as a thermal bridge for accurate sensing.

Various embodiments may relate to intelligent power modules with integrated health sensing devices and dual side cooling capability. Various embodiments may be able to provide better thermal performance by utilizing double side cooling scheme and assembling with 3D copper lead frame, which has high thermal conductivity. In addition, various embodiments may possess a small form factor, may be light weight, and/or may have low cost by assembling with the thin 3D copper lead frame for vertical interconnection. For instance, the thin lead frame may be light and occupy less space compared to thick DBC substrates. In addition, the lead frame may be less expensive compared to ceramic based DBC substrates. The integration of monitoring sensor may lead to enhanced safety features.

Furthermore, double side cooling heat sinks may be integrated to the power module through adhesive, coated dielectric material. No additional bonding or clamping may be required. Monitoring sensors may be embedded into the power modules and linked with the power chips through 3D lead frame which may act as a thermal bridge to achieve accurate sensing.

Various embodiments may find applications in automotive power trains—inverters, in green and renewable energy industry—power inverter units in generators, in aerospace/marine/train high power inverter modules, and in industrial equipment high power inverter modules.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A semiconductor package comprising:
a first package interconnection component;
a second package interconnection component;
a first electrical component between the first package interconnection component and the second package interconnection component, the first electrical component having a first side and a second side opposite the first side;
a first bonding layer bonding the first side of the first electrical component and a first portion of the first package interconnection component;
a second bonding layer bonding the second side of the first electrical component and a first portion of the second package interconnection component;
a third bonding layer bonding a second portion of the first package interconnection component and a second portion of the second package interconnection component;
a second electrical component having a first side and a second side opposite the first side;
a fourth bonding layer bonding the first side of the second electrical component and the second portion of second package interconnection component;
a first heat sink;
a second heat sink;
a first interface layer bonding the first heat sink and the first package interconnection component;
a second interface layer bonding the second heat sink and the second package interconnection component;
a third package interconnecting component;
a fifth bonding layer bonding the second side of the second electrical component and a first portion of the third package interconnecting component so that the second electrical component is between the second package interconnecting component and the third package interconnecting component; and
a sixth bonding layer bonding a second portion of the third package interconnecting component and a third portion of the package interconnecting component.
2. The semiconductor package according to claim 1, wherein the first electrical component is a power chip; and wherein the second electrical component is a temperature sensor or a current sensor.

3. The semiconductor package according to claim 1,
wherein the first package interconnection component is a lead frame or a flexible printed circuit; and
wherein the second package interconnection component is a lead frame or a flexible printed circuit.

4. The semiconductor package according to claim 1,
wherein the second package interconnection component is bent to define the first portion, the second portion, and an intervening portion between the first portion and the second portion.

5. The semiconductor package according to claim 4,
wherein the intervening portion of the second package interconnection component is perpendicular to the first portion of the second package interconnection component, and also perpendicular to the second portion of the second package interconnection component.

6. The semiconductor package according to claim 1, wherein the third package interconnection component is bent to define the first portion, the second portion, and an intervening portion between the first portion and the second portion.

7. The semiconductor package according to claim 6,
wherein the intervening portion of the third package interconnection component is perpendicular to the first portion of the third package interconnection component, and also perpendicular to the second portion of the third package interconnection component.

8. The semiconductor package according to claim 1,
wherein the first interface layer and the second interface layer comprise a dielectric material.

9. The semiconductor package according to claim 1, further comprising:
a mold encapsulation covering at least a portion of the first electrical component and at least a portion of the second electrical component.

10. The semiconductor package according to claim 1, further comprising:
one or more further electrical components between the first package interconnection component and the second package interconnection component.

11. The semiconductor package according to claim 10,
wherein the one or more further electrical components comprises a Schottky barrier diode.

12. A method of forming a semiconductor package, the method comprising:
bonding a first side of a first electrical component and a first portion of a first package interconnection component via a first bonding layer;
bonding a second side of the first electrical component, the second side of the first electrical component opposite the first side, and a first portion of a second package interconnection component via a second bonding layer so that the first electrical component is between the first package interconnection component and the second package interconnection component;
bonding a second portion of the first package interconnection component and a second portion of the second package interconnection component via a third bonding layer;
bonding a first side of a second electrical component and the second portion of second package interconnection component via a fourth bonding layer, the second electrical component also comprising a second side opposite the first side; bonding a first heat sink and the first package interconnection component via a first interface layer;
bonding a second heat sink and the second package interconnection component via a second interface layer,
bonding the second side of the second electrical component and a first portion of a third package interconnecting component vie a fifth bonding layer so that the second electrical component is between the second package interconnection component and the third package interconnection component; and
bonding a second portion of the third package interconnection component and a third portion of the first package interconnection component via a sixth bonding layer.

13. The method according to claim 12,
wherein the first electrical component is a power chip; and
wherein the second electrical component is a temperature sensor or a current sensor.

14. The method according to claim 12,
wherein the first package interconnection component is a lead frame or a flexible printed circuit; and
wherein the second package interconnection component is a lead frame or a flexible printed circuit.

15. The method according to claim 12,
wherein the second side of the second electrical component is bonded with the first portion of the third package interconnection component before the first side of the second electrical component is bonded with the second portion of second package interconnection component.

16. The method according to claim 12,
wherein the first side of the second electrical component is bonded with the second portion of second package interconnection component before the second side of the second electrical component is bonded with the first portion of the third package interconnection component.

17. The method according to claim 12, further comprising:
forming a mold encapsulation to cover at least a portion of the first electrical component and at least a portion of the second electrical component.

18. The method according to claim 12, further comprising:
providing one or more further electrical components between the first package interconnection component and the second package interconnection component.

* * * * *